United States Patent
Ning

(10) Patent No.: US 11,894,088 B2
(45) Date of Patent: Feb. 6, 2024

(54) METHOD FOR READING AND WRITING AND MEMORY DEVICE

(71) Applicant: CHANGXIN MEMORY TECHNOLOGIES, INC., Hefei (CN)

(72) Inventor: Shuliang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 308 days.

(21) Appl. No.: 17/347,525

(22) Filed: Jun. 14, 2021

(65) Prior Publication Data
US 2021/0313003 A1    Oct. 7, 2021

Related U.S. Application Data

(63) Continuation of application No. PCT/CN2020/130390, filed on Nov. 20, 2020.

(30) Foreign Application Priority Data

Apr. 1, 2020 (CN) .......................... 202010249662.8

(51) Int. Cl.
G11C 29/12  (2006.01)
G11C 29/18  (2006.01)
(Continued)

(52) U.S. Cl.
CPC .......... G11C 29/42 (2013.01); G11C 29/1201 (2013.01); G11C 29/18 (2013.01);
(Continued)

(58) Field of Classification Search
CPC ..... G11C 29/42; G11C 29/1201; G11C 29/18; G11C 29/4401; G11C 2029/1802; H03K 19/17728
(Continued)

(56) References Cited

U.S. PATENT DOCUMENTS 5,841,711 A    11/1998  Watanabe
5,996,096 A    11/1999  Dell et al.
(Continued)

FOREIGN PATENT DOCUMENTS

CN    1832049 A     9/2006
CN    101145372 A   3/2008
(Continued)

OTHER PUBLICATIONS

State Intellectual Property Office of the People's Republic of China, First Office Action Issued in related Application No. 202010249668.5, dated Jan. 12, 2023, 8 pages.
(Continued)

*Primary Examiner* — Ly D Pham
(74) *Attorney, Agent, or Firm* — Kilpatrick Townsend & Stockton LLP

(57) ABSTRACT

The embodiments provide a method for reading and writing and a memory device. The method includes: applying a read command to the memory device, the read command pointing to address information; reading data to be read out from a memory cell corresponding to the address information pointed to by the read command; and setting a mark of the address information pointed to by the read command as invalid if an error occurs in the data to be read out, and backing up the address information pointed to by the read command and the mark into a non-volatile memory cell according to a preset rule.

17 Claims, 6 Drawing Sheets

(51) Int. Cl.
*G11C 29/42* (2006.01)
*G11C 29/44* (2006.01)
*H03K 19/17728* (2020.01)

(52) U.S. Cl.
CPC ... *G11C 29/4401* (2013.01); *H03K 19/17728* (2013.01); *G11C 2029/1802* (2013.01)

(58) Field of Classification Search
USPC .................................................. 365/185.09
See application file for complete search history.

(56) References Cited

U.S. PATENT DOCUMENTS

| | | | |
|---|---|---|---|
| 9,037,928 B2 | 5/2015 | Kleveland et al. | |
| 9,741,455 B1 * | 8/2017 | Park | G11C 29/76 |
| 10,643,668 B1 | 5/2020 | Poudyal et al. | |
| 11,527,301 B2 | 12/2022 | Ning et al. | |
| 2002/0097613 A1 | 7/2002 | Raynham | |
| 2002/0169996 A1 | 11/2002 | King et al. | |
| 2003/0133336 A1 | 7/2003 | Chen | |
| 2003/0156469 A1 | 8/2003 | Viehmann et al. | |
| 2004/0003315 A1 | 1/2004 | Lakhani et al. | |
| 2006/0140027 A1 | 6/2006 | Tominaga | |
| 2007/0113155 A1 | 5/2007 | Takahashi | |
| 2007/0294570 A1 | 12/2007 | Polisetti et al. | |
| 2008/0181035 A1 | 7/2008 | Kawasumi | |
| 2010/0229033 A1 | 9/2010 | Maeda et al. | |
| 2010/0269000 A1 | 10/2010 | Lee | |
| 2010/0332895 A1 | 12/2010 | Billing et al. | |
| 2010/0332950 A1 | 12/2010 | Billing et al. | |
| 2011/0119558 A1 | 5/2011 | Koshiyama et al. | |
| 2012/0166710 A1 | 6/2012 | Ou | |
| 2012/0254511 A1 | 10/2012 | Yeh | |
| 2013/0179724 A1 | 7/2013 | Cordero et al. | |
| 2014/0075265 A1 | 3/2014 | Hung et al. | |
| 2014/0376320 A1 | 12/2014 | Loh et al. | |
| 2015/0019804 A1 | 1/2015 | Nemazie et al. | |
| 2015/0127972 A1 | 5/2015 | Chun et al. | |
| 2015/0143198 A1 | 5/2015 | Chun et al. | |
| 2015/0186198 A1 | 7/2015 | Dong et al. | |
| 2015/0293809 A1 | 10/2015 | Liang et al. | |
| 2015/0347254 A1 | 12/2015 | Jones et al. | |
| 2015/0363425 A1 | 12/2015 | Li et al. | |
| 2016/0147599 A1 | 5/2016 | Kim | |
| 2016/0357462 A1 | 12/2016 | Nam et al. | |
| 2016/0364153 A1 | 12/2016 | Nam et al. | |
| 2017/0123879 A1 | 5/2017 | Donlin | |
| 2017/0132075 A1 | 5/2017 | Zastrow et al. | |
| 2017/0139839 A1 | 5/2017 | Ke et al. | |
| 2017/0262178 A1 | 9/2017 | Hashimoto | |
| 2017/0308433 A1 | 10/2017 | Kwon et al. | |
| 2017/0372799 A1 | 12/2017 | Bacchus | |
| 2018/0158535 A1 | 6/2018 | Kim et al. | |
| 2019/0129776 A1 | 5/2019 | Hsiao et al. | |
| 2019/0371391 A1 | 12/2019 | Cha et al. | |
| 2019/0377631 A1 | 12/2019 | Hattori | |
| 2019/0385693 A1 | 12/2019 | Shin et al. | |
| 2020/0004652 A1 | 1/2020 | Niu et al. | |
| 2021/0055981 A1 | 2/2021 | Miller et al. | |
| 2021/0311836 A1 | 10/2021 | Ning et al. | |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102004698 A | 4/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105723344 A | 6/2016 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| TW | 201706842 A | 2/2017 |
| WO | 2012019475 A1 | 2/2012 |

OTHER PUBLICATIONS

State Intellectual Property Office of the People's Republic of China, First Office Action Issued in related Application No. 202010249989.5, dated Jan. 19, 2023, 10 pages.

State Intellectual Property Office of the People's Republic of China, First Office Action Issued in related Application No. 202010250023.3, dated Jan. 19, 2023, 12 pages.

State Intellectual Property Office of the People's Republic of China, First Office Action issued in Application No. 202010250011.0, dated Feb. 15, 2023, 9 pages.

State Intellectual Property Office of the People's Republic of China, First Office Action issued in Application No. 202010250426.8, dated Feb. 16, 2023, 12 pages.

European Patent Office, Office Action Issued in Application No. 20928300.1, dated Feb. 22, 2023, Germany, 11 pages.

European Patent Office, Extended European Search Report Issued in Application No. 20926358.1, dated Jul. 17, 2023, Germany, 7 pages.

United States Patent and Trademark Office, Non-Final office action issued in related U.S. Appl. No. 17/363,013 dated Aug. 3, 2023, total 11 pages.

United States Patent and Trademark Office, Non-Final office action issued in related U.S. Appl. No. 17/310,495 dated Jul. 31, 2023, total 14 pages.

United States Patent and Trademark Office, Non-Final office action issued in related U.S. Appl. No. 17/342,498 dated Jul. 19, 2023, total 15 pages.

State Intellectual Property Office of the People's Republic of China, Office Action Issued in Application No. 202010250008.9, dated Jul. 2001, 8 pages.

United States Patent and Trademark Office, Non-Final office action issued in related U.S. Appl. No. 17/396,692 dated Jul. 7, 2023, total 10 pages.

European Patent Office, Summons to attend oral proceedings issued in Application No. 20928300.1, dated Nov. 15, 2023, Germany, 11 pages.

* cited by examiner

METHOD FOR READING AND WRITING AND MEMORY DEVICE

CROSS REFERENCE

This application is a continuation of PCT/CN2020/130390, filed Nov. 20, 2020, which claims priority to Chinese Patent Application No. 202010249662.8, titled "METHOD FOR READING AND WRITING AND MEMORY DEVICE" and filed on Apr. 1, 2020, the entire contents of which are incorporated herein by reference.

TECHNICAL FIELD

The present disclosure relates to the field of semiconductor memory technologies, and more particularly, to a method for reading and writing and a memory device.

BACKGROUND

Semiconductor memories are memory components for storing various data and information. With the increase in circuit complexity, various forms of memory devices are inevitably prone to produce defective or damaged memory cells during manufacturing or during use, resulting in reduced reliability of the semiconductor memory devices.

Therefore, how to improve the reliability of the memory devices has become an urgent problem to be solved at present.

SUMMARY

A technical problem to be solved by the present disclosure is to provide a method for reading and writing and a memory device to greatly improve the reliability of the memory device and prolong lifespan of the memory device.

The present disclosure provides a method for reading and writing, which includes following steps. A read command is applied to a memory device, wherein the read command points to address information. Data to be read out is read from a memory cell corresponding to the address information pointed to by the read command. A mark of the address information pointed to by the read command is set as invalid if an error occurs in the data to be read out, and the address information pointed to by the read command and the mark are backed up into a non-volatile memory cell according to a preset rule.

Further, the preset rule is a preset cycle or a preset action.

Further, the method for reading and writing also includes: loading the address information and the mark from the non-volatile memory cell after the memory device is enabled.

Further, address information not marked as invalid is initially set as valid.

Further, the step of reading data to be read out from a memory cell corresponding to the address information pointed to by the read command also includes: reading, from the memory cell corresponding to the address information pointed to by the read command, a first error correction code (ECC) corresponding to the data to be read out. A method for determining whether an error occurs in the data to be read out includes: decoding the first ECC to determine whether the error occurs in the data to be read out.

Further, a lookup table is provided, wherein address information of the memory cell and an initial mark of the address information are recorded in the lookup table. The initial mark of the address information pointed to by the read command is revised as invalid in the lookup table if an error occurs in the data to be read out.

Further, the initial mark includes valid or invalid.

Further, a write command is applied to the memory device. A write operation is performed on a memory cell corresponding to address information pointed to by the write command if a mark of the address information pointed to by the write command is valid. It is stopped performing the write operation on the memory cell corresponding to the address information pointed to by the write command if the mark of the address information pointed to by the write command is invalid.

Further, when applying a write command to the memory device, the mark is looked up from the lookup table by taking the address information pointed to by the write command as an index.

Further, after the step of stopping performing the write operation on the memory cell corresponding to the address information pointed to by the write command, the method for reading and writing also includes: converting the address information pointed to by the write command to another address information.

Further, the step of performing a write operation on the memory cell corresponding to the address information pointed to by the write command also includes: forming a second ECC corresponding to data to be written in the write operation, and writing the second ECC together with the data to be written into the memory cell corresponding to the address information pointed to by the write command.

Further, after the applying a read command to the memory device, and before the reading data to be read out from a memory cell corresponding to the address information pointed to by the read command, the method also includes following steps. It is determined whether the address information pointed to by the read command is valid. A read operation is performed on the memory cell corresponding to the address information pointed to by the read command if the address information pointed to by the read command is valid.

Further, it is determined, if the address information pointed to by the read command is invalid, whether a write command has been executed on the address information pointed to by the read command after the address information pointed to by the read command is marked as invalid. The read command points to address information pointed to by the write command to perform a read operation on a memory cell corresponding to the address information pointed to by the read command if a determination result is yes.

The present disclosure also provides a memory device, which includes: a command receiving unit, configured to receive a read/write command; a memory cell, configured to correspond to address information pointed to by the read/write command; an execution unit, configured to perform a read/write operation on the memory cell; a marking unit, configured to store address information and mark information corresponding to the address information, wherein the mark information records whether the address information is valid or invalid; and a non-volatile memory cell, configured to back up the address information and the mark information according to a preset rule.

Further, the memory device also includes a loading unit, wherein the loading unit is connected to the marking unit and the non-volatile memory cell, and the loading unit is configured to load the address information and the mark information backed up in the non-volatile memory cell into the marking unit.

Further, the memory device also includes an ECC decoding unit, wherein the ECC decoding unit is configured to decode a first ECC corresponding to data to be read out in the read operation and to form a second ECC corresponding to data to be written in the write operation.

Further, the marking unit is a lookup table, address information of the memory cell and an initial mark of the address information are recorded in the lookup table, and the initial mark of the address information is revised as invalid in the lookup table if an error occurs in the data to be read out.

Further, the execution unit is also connected to the marking unit, and the execution unit is configured to perform a read/write operation on the memory cell corresponding to the address information, or to stop performing the read/write operation on the memory cell corresponding to the address information according to the mark information of the marking unit.

Further, the memory device also includes a conversion unit, wherein the conversion unit is configured to convert the address information pointed to by the read/write command to another address information after stopping performing the read/write operation on the memory cell corresponding to the address information.

Further, the memory device includes a logic layer and at least one memory layer. The command receiving unit, the marking unit and the execution unit are arranged in the logic layer, the memory cell is arranged in the memory layer, and the non-volatile memory cell is arranged in the logic layer or the memory layer.

Advantages of the present disclosure are as below. When a user performs a read/write operation on the memory device, address information of the memory cell is marked to differentiate a valid memory cell from an invalid memory cell in real time. That is, every time when the read operation is performed, the address information of the invalid memory cell may be marked, such that when the user performs the read/write operation on the memory device, the read/write operation is only performed on the valid memory cell instead of the invalid memory cell, thereby avoiding data error or data loss. Therefore, the reliability of the memory device is greatly improved, and the lifespan of the memory device is prolonged. In addition, according to the method for reading and writing provided by the present disclosure, the address information pointed to by the read command and the mark are backed up into the non-volatile memory cell according to the preset rule, to serve as a basis for the subsequent read/write operation, which can prevent the address information having been marked from being re-marked after the memory device is powered on again. In this way, a running speed of the memory device can be greatly increased.

DETAILED DESCRIPTION

Embodiments of a method for reading and writing and a memory device provided by the present disclosure are described below in detail with reference to the accompanying drawings.

A common method for improving reliability of a memory device includes: encoding data as an error correction code (ECC) before the data is written into the memory device, and simultaneously storing the data and the ECC into the memory device. When reading, both the data and the ECC are read simultaneously, and the ECC is decoded to restore data where an error likely occurs.

However, it is found that the ECC can only correct data when the data is read out, and in a memory there still exists a memory cell with data error. In a subsequent data storage process, if at least one memory cell with data error reoccurs in a memory segment corresponding to the above memory cell with data error, in this memory segment there may exist at least two memory cells with data error. However, the ECC will be unable to correct the error, causing this memory segment to be unserviceable, or even causing the memory device to be unserviceable, thereby having a negative effect on the reliability and lifespan of the memory device.

By study, it is found that when a user uses the memory device, a basis can be provided for performing a subsequent read/write operation by marking a memory cell with data error in real time, which can greatly improve the reliability of the memory device. Therefore, the present disclosure provides a method for reading and writing, which not only can mark a memory cell with data error in real time, but also can back up address information of the memory cell into a non-volatile memory cell according to a preset rule.

Figure 1:
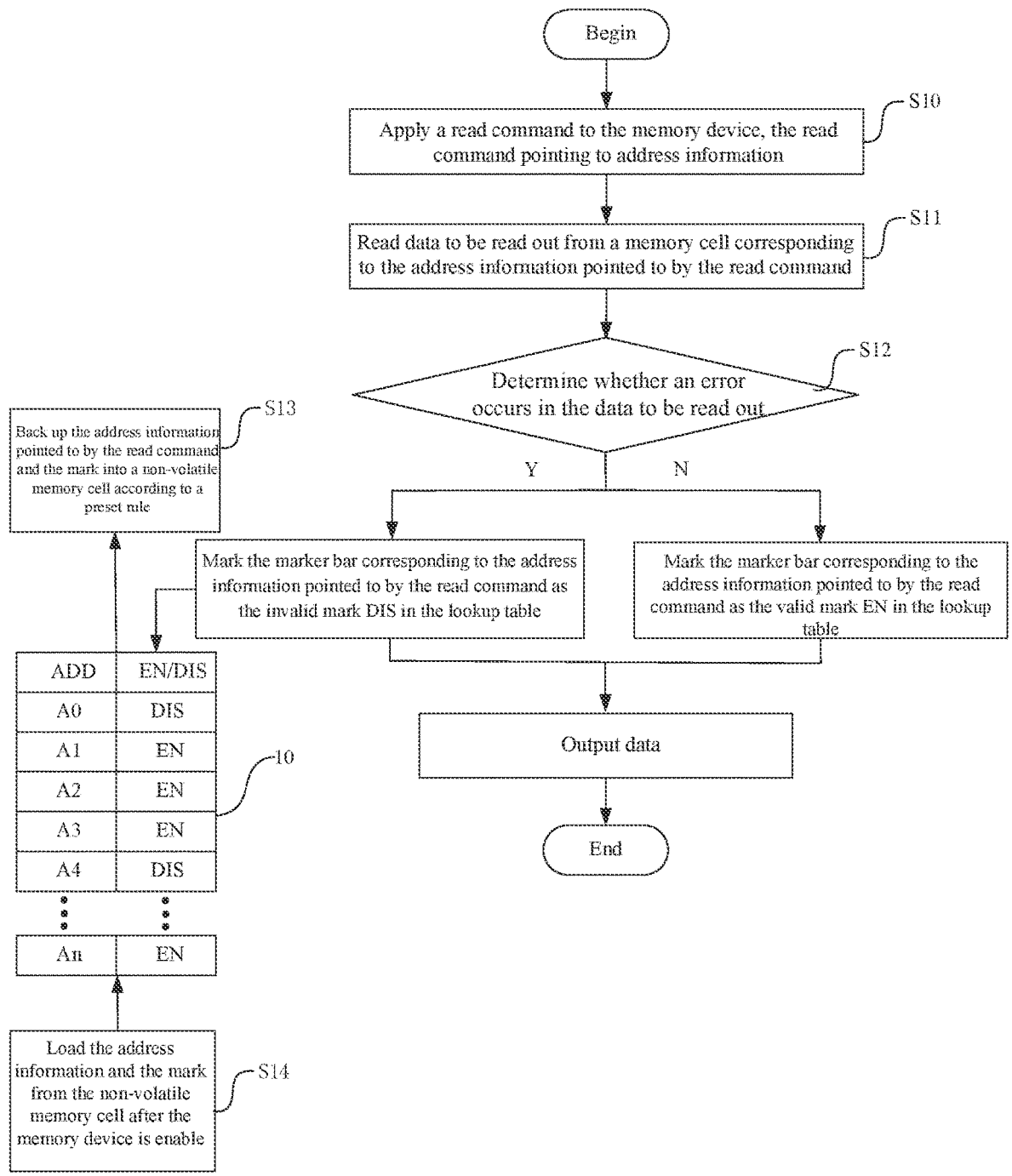
FIG. 1 is a schematic flow diagram of a method for reading and writing according to a first embodiment of the present disclosure.

In a first embodiment of the method for reading and writing provided by the present disclosure, when performing a read operation, address information corresponding to a memory cell where an error occurs in data to be read out is marked. In some embodiments, with reference to FIG. 1, a schematic flow diagram of the method for reading and writing according to the first embodiment of the present disclosure is illustrated, and the method for reading and writing includes following steps.

In Step S10, a read command is applied to a memory device, wherein the read command points to address information. For example, the address information pointed to by the read command is denoted by A0.

In Step S11, data to be read out is read from a memory cell corresponding to the address information pointed to by the read command. For example, data to be read out is read from a memory cell corresponding to the address information A0.

In Step S12, it is determined whether an error occurs in the data to be read out.

If an error occurs in the data to be read out, this means that the memory cell is invalid. In this case, a mark of the address information pointed to by the read command is set as invalid.

In this embodiment, a lookup table 10 is provided, wherein the lookup table 10 is provided with an address information bar ADD and a marker bar EN/DIS. All address information of the memory device is prestored in the address information bar ADD, such as A0, A1, A2, A3, A4, A5, A6 . . . An. The amount of the address information may be set based on actual situations of the memory device. The marker bar EN/DIS is configured for storing a mark of the address information, wherein the mark includes an invalid mark DIS marking the address information as invalid or a valid mark EN marking the address information as valid. In one embodiment, the invalid mark DIS and the valid mark EN may be represented by a binary code (for example, if the invalid mark DIS and the valid mark EN are one-bit binary codes, the valid mark EN may be represented by 1, and the invalid mark DIS may be represented by 0), but the present disclosure is not limited thereto. Each of the address information corresponds to one mark.

In some embodiments, if an error occurs in the data to be read out read from the memory cell corresponding to the address information A0 pointed to by a read command, the marker bar corresponding to the address information A0 pointed to by the read command is marked as the invalid mark DIS in the lookup table 10. If an error occurs in the data to be read out read from the memory cell corresponding to the address information A4 pointed to by a read command, the marker bar corresponding to the address information A4 pointed to by the read command is marked as the invalid mark DIS in the lookup table 10.

If no error occurs in the data to be read out, this means that the memory cell is valid. In this case, there are two processing modes as below.

In the first processing mode, if no error occurs in the data to be read out, the marker bar corresponding to the address information pointed to by the read command is marked as the valid mark EN in the lookup table 10. For example, if no error occurs in the data to be read out read from the memory cell corresponding to the address information A1 pointed to by a read command, the marker bar corresponding to the address information A1 pointed to by the read command is marked as the valid mark EN in the lookup table 10.

In the second processing mode, the marker bars corresponding to all the address information are initially set as the valid marks EN in the lookup table. If no error occurs in the data to be read out, the marks of the marker bars in the lookup table are not revised, i.e., initial settings of the marker bars are retained. For example, if no error occurs in the data to be read out read from the memory cell corresponding to the address information A1 pointed to by a read command, the marker bar corresponding to the address information A1 pointed to by the read command is marked as the valid mark EN in the lookup table. That is, the initial settings of the marker bar are not revised. In this embodiment, the second processing mode is adopted.

In the second processing mode, the valid mark EN of the marker bar corresponding to the address information pointed to by a read command is not revised as the invalid mark DIS in the lookup table 10 unless an error occurs in the data to be read out read from the memory cell corresponding to the address information pointed to by the read command. For example, if an error occurs in the data to be read out read from the memory cell corresponding to the address information A0 pointed to by a read command, the valid mark EN of the marker bar corresponding to the address information A0 pointed to by the read command is revised as the invalid mark DIS in the lookup table 10.

Further, in the second processing mode, when the memory device is powered on or shipped out of factory, the marker bars corresponding to all the address information are initially set as the valid marks EN in the lookup table. It is to be understood that in the use of the memory device, after performing a read/write operation on the memory device for many times, in the lookup table, the marker bar corresponding to the address information likely is the invalid mark DIS or likely is the valid mark EN. Therefore, when a read command is applied to the memory device, the lookup table after a previous read/write operation is an initial lookup table of the current read operation, and a mark of the address information of the memory cell after the previous read/write operation is recorded in the initial lookup table, wherein the mark is an initial mark of the current read operation, and the initial mark likely is the invalid mark DIS or the valid mark EN. If an error occurs in the data to be read out, the initial mark of the address information pointed to by the read command is revised as invalid mark DIS in the lookup table.

Further, the method for reading and writing provided by the present disclosure also includes a step as below. In Step S13, the address information pointed to by the read command and the mark are backed up into a non-volatile memory cell according to a preset rule. In some embodiments, in this embodiment, the lookup table 10 is backed up into the non-volatile memory cell according to a preset rule.

The preset rule may be a preset cycle or a preset action.

The preset cycle may be a preset time cycle after the memory device is powered on. For example, after the memory device is powered on, the address information pointed to by the read command and the mark are backed up into the non-volatile memory cell according to the preset rule in a cycle of ten minutes. That is, after the memory device is powered on, the address information pointed to by the read command and the mark are backed up into the non-volatile memory cell according to the preset rule every ten minutes. In some embodiments, the address information pointed to by the read command and the mark are backed up into the non-volatile memory cell according to the preset rule in a cycle of one hour. That is, after the memory device is powered on, the address information pointed to by the read command and the mark are backed up into the non-volatile memory cell according to the preset rule every one hour.

The preset action may be an operation received by the memory device. For example, the preset action may be an operation of shutting down the memory device, an operation of restarting the memory device, and a trigger operation set by a user or system including backing up the address information and marking instructions, etc. The trigger operation may be any operation of issuing a trigger instruction, such as an operation of clicking a certain trigger button by the user, or an operation of disabling a certain trigger button, which is not limited in the present disclosure.

According to the method for reading and writing provided by the present disclosure, the address information and the mark thereof are backed up into the non-volatile memory cell. If the memory device is powered down, the address information and the mark thereof may still be recorded in the non-volatile memory cell and are not erased, to serve as a basis for a subsequent read/write operation.

Further, the method for reading and writing provided by the present disclosure also includes following step. In Step S14, the address information and the mark are loaded from the non-volatile memory cell after the memory device is enabled (that is, after the memory device is powered on again). In some embodiments, in this embodiment, the lookup table 10 is loaded from the non-volatile memory cell after the memory device is enabled (that is, after the memory device is powered on again). The mark of the address information recorded in the lookup table 10 serves as an initial mark of the subsequent read/write operation, which can prevent the address information having been marked from being re-marked after the memory device is powered on again. In this way, it is avoided re-marking an invalid memory cell, and thus the running speed of the memory device is greatly increased.

Further, the present disclosure also provides a method for determining whether an error occurs in the data to be read out. In some embodiments, the step of reading data to be read out from a memory cell corresponding to the address information pointed to by the read command further includes: reading, from the memory cell corresponding to the address information pointed to by the read command, a first error correction code (ECC) corresponding to the data to be read out. For example, number of bits of data read from the memory cell corresponding to the address information pointed to by the read command is 64b+8b, wherein 64b represents the number of bits of the data to be read out, and 8b represents the number of bits of the first ECC. According to a corresponding algorithm, the first ECC is decoded to restore data where an error likely occurs. The algorithm belongs to the existing technologies, and thus is not to be described in detail. Therefore, it may be determined whether an error occurs in the data to be read out by decoding the first ECC.

The present disclosure enumerates a method for determining whether an error occurs in the data to be read out by decoding the first ECC. This method includes following steps. The data to be read out is re-encoded to form a new ECC, and an XOR comparison is performed between the new ECC and the first ECC. If the new ECC is consistent with the first ECC in each bit, this means that no error occurs in the data to be read out, and the memory cell is valid. In this case, the lookup table 10 is not revised, and the mark of the address information corresponding to the memory cell is the valid mark EN. If the new ECC is inconsistent with the first ECC, this means that an error occurs in the data to be read out, and the memory cell is invalid. In this case, the mark of the address information pointed to by the read command is set as the invalid mark DIS in the lookup table 10.

If no error occurs in the data to be read out, the data to be read out is used as output data of the memory device. If an error occurs in the data to be read out, the first ECC may be employed to store data, and the stored data is used as the output data of the memory device.

According to the method for reading and writing provided by the present disclosure, when a user performs a read/write operation on the memory device, address information of the memory cell is marked to differentiate a valid memory cell from an invalid memory cell in real time. That is, every time when the read operation is performed, the address information of the invalid memory cell may be marked, such that when the user performs the read/write operation on the memory device, the read/write operation is only performed on the valid memory cell instead of the invalid memory cell. Therefore, data error or data loss are avoided, and thus the reliability of the memory device is greatly improved.

Further, according to the method for reading and writing provided by the present disclosure, the address information pointed to by the read command and the mark are backed up into the non-volatile memory cell according to the preset rule, and the address information and the mark are loaded from the non-volatile memory cell after the memory device is powered on again. The mark serves as the initial mark of the subsequent read/write operation, which can prevent the address information having been marked from being re-marked after the memory device is powered on again, which greatly increases the running speed of the memory device.

The method for reading and writing provided by the present disclosure also provides a second embodiment. After applying a read command to the memory device, and before reading data to be read out from a memory cell corresponding to the address information pointed to by the read command, the method for reading and writing also includes a step of determining whether the address information pointed to by the read command is valid. In some embodiments, with reference to FIG. 2, a schematic flow diagram of the method for reading and writing according to the second embodiment of the present disclosure is illustrated.

In Step S20, a read command is applied to the memory device, wherein the read command points to address information.

In Step S21, it is determined whether the address information pointed to by the read command is valid.

In some embodiments, when applying a read command to the memory device, the mark is looked up from the lookup table by taking the address information pointed to by the read command as an index. In the lookup table, if the mark of the marker bar corresponding to the address information pointed to by the read command is the valid mark EN, this means that the address information pointed to by the read command is valid. However, if the mark of the marker bar corresponding to the address information pointed to by the read command is the invalid mark DIS, this means that the address information pointed to by the read command is invalid.

For example, if the address information pointed to by the read command is the address information A1, the mark is looked up from the lookup table 20 by taking the address information A1 pointed to by the read command as an index. In the lookup table 20, if the mark of the marker bar corresponding to the address information A1 pointed to by the read command is the valid mark EN, this means that the address information A1 pointed to by the read command is valid.

For another example, the address information pointed to by the read command is the address information A4. The mark is looked up from the lookup table 20 by taking the address information A4 pointed to by the read command as the index. In the lookup table 20, if the mark of the marker bar corresponding to the address information A4 pointed to by the read command is the invalid mark DIS, this means that the address information A4 pointed to by the read command is invalid.

If the address information pointed to by the read command is valid, the read operation is performed on the memory cell corresponding to the address information pointed to by the read command, i.e., Step S22 is performed. For example, in the lookup table 20, if the mark of the marker bar corresponding to the address information A1 pointed to by the read command is the valid mark EN, this means that the memory cell corresponding to the address information A1 pointed to by the read command is valid. In this case, the read operation is performed on the memory cell corresponding to the address information A1 pointed to by the read command, i.e., Step S22 is performed. In Step S22, the address information pointed to by the read command is the address information A1.

Figure 2:
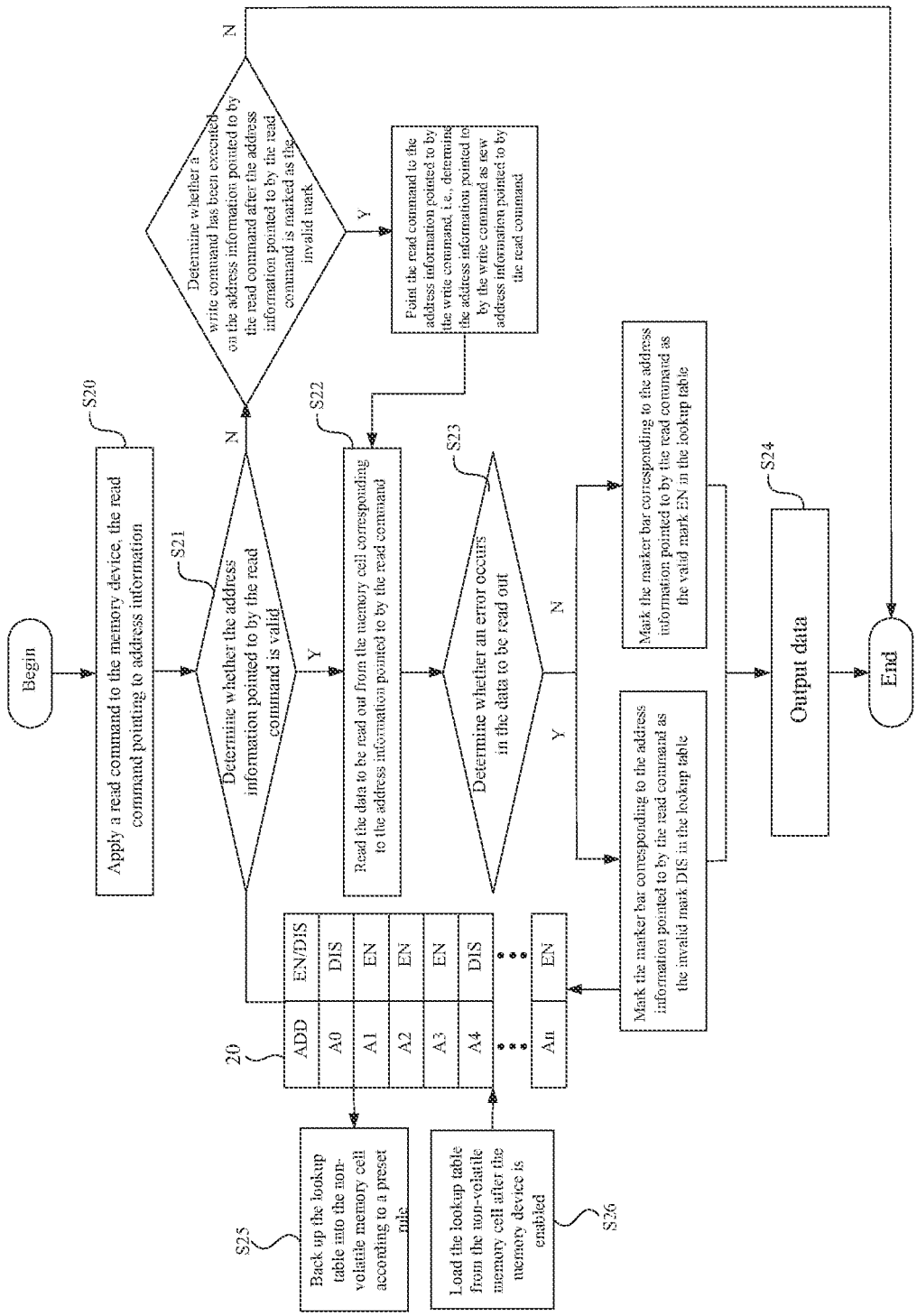
FIG. 2 is a schematic flow diagram of a method for reading and writing according to a second embodiment of the present disclosure.

If the address information pointed to by the read command is invalid, i.e., in the lookup table 20, if the mark of the marker bar corresponding to the address information pointed to by the read command is the invalid mark DIS, this means that the memory cell corresponding to the address information pointed to by the read command is invalid. In this case, it is determined, in an operation prior to the current read operation, whether a write command has been executed on the address information pointed to by the read command after the mark of the marker bar corresponding to the address information pointed to by the read command is marked as the invalid mark. If a determination result is yes, the read command points to the address information pointed to by the write command, i.e., the address information pointed to by the write command is determined as new address information pointed to by the read command, and Step S22 is performed on the new address information. If the determination result is no, there are two processing modes as below. In one processing mode as shown in FIG. 2 of this embodiment, the read operation is stopped. In the other processing mode, it is continued to perform the read operation, and the data restored by using the first ECC is used as the output data of the memory device.

For example, in the lookup table 20, if the mark of the marker bar corresponding to the address information A4 pointed to by the read command is the invalid mark DIS, it is determined, in an operation prior to the current read operation, whether a write command has been executed on the address information A4 pointed to by the read command after the mark of the marker bar corresponding to the address information A4 pointed to by the read command is marked as the invalid mark DIS. If the determination result is yes, and the write command points to another address information A1, the read command points to the address information A1 pointed to by the write command, to perform the read operation on the memory cell corresponding to the address information A1 pointed to by the read command, i.e., Step S22 is performed. In Step S22, the address information pointed to by the read command is the address information A1. Reference is made to a third embodiment for implementation of the write command. If the determination result is no, the read operation is stopped.

In Step S22, the data to be read out is read from the memory cell corresponding to the address information pointed to by the read command. For example, the data to be read out is read from the memory cell corresponding to the address information A1 pointed to by the read command. This step is the same as Step S11 in the first embodiment.

In Step S23, it is determined whether an error occurs in the data to be read out. This step is the same as Step S12 in the first embodiment. If an error occurs in the data to be read out, the mark of the marker bar corresponding to the address information pointed to by the read command is marked as the invalid mark DIS in the lookup table 20. If no error occurs in the data to be read out, the mark of the marker bar corresponding to the address information pointed to by the read command is marked as the valid mark EN in the lookup table 20. The lookup table 20 is not revised when all the marker bars of the lookup table 20 are initially set as the valid marks EN.

In Step S24, data is outputted.

In Step S25, the lookup table 20 is backed up into the non-volatile memory cell according to a preset rule. This step is the same as Step S13, and the preset rule may be a preset cycle or a preset action.

In Step S26, the lookup table 20 is loaded from the non-volatile memory cell after the memory device is enabled. This step is the same as Step S14. The mark of the address information recorded in the lookup table 20 serve as the initial mark of the subsequent read/write operation, which can prevent the address information having been marked from being re-marked after the memory device is powered on again. Therefore, the running speed of the memory device can be greatly increased.

In the second embodiment, after a read command is applied to the memory device, it is determined whether the address information pointed to by the read command is valid, such that the read command may be selectively executed on the address information pointed to by the read command. Thus, the reliability of the memory device can be improved. Furthermore, after the data to be read out is read out, the address information of the memory cell is marked according to a fact whether an error occurs in the data to be read out, to provide a basis of determination for the subsequent read/write operation.

Figure 3:
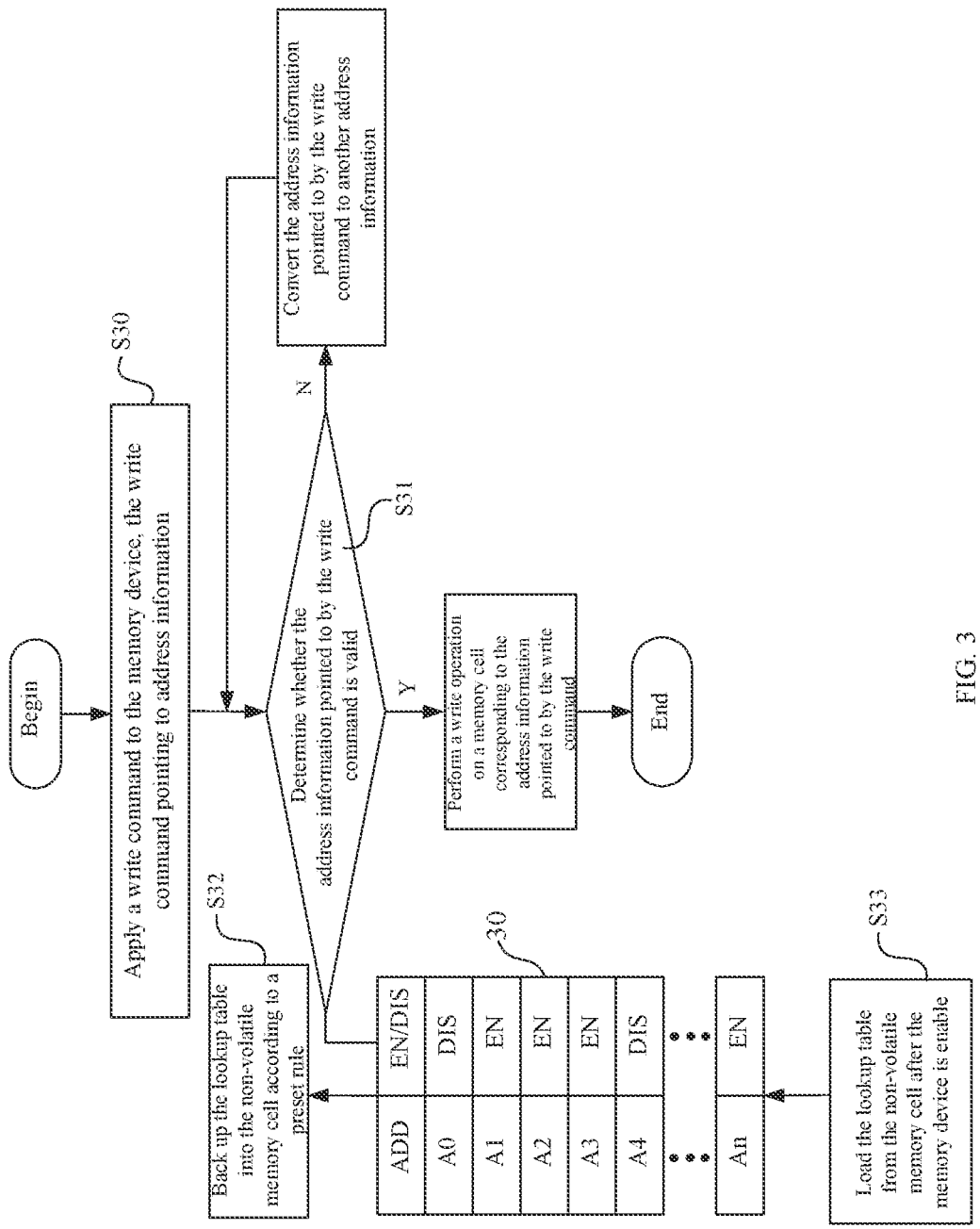
FIG. 3 is a schematic flow diagram of a method for reading and writing according to a third embodiment of the present disclosure.

The method for reading and writing provided by the present disclosure also provides a third embodiment. In the third embodiment, a write operation is performed on the memory device. In some embodiments, with reference to FIG. 3, a schematic flow diagram of the method for reading and writing according to the third embodiment of the present disclosure is illustrated.

In Step S30, a write command is applied to the memory device, wherein the write command points to address information. For example, a write command is applied to the memory device, wherein the write command points to address information A0.

In Step S31, it is determined whether a mark of the address information pointed to by the write command is valid.

In this embodiment, a mark corresponding to the address information is looked up from the lookup table by taking the address information pointed to by the write command as an index, to determine whether the address information pointed to by the write command is valid based on the mark.

For example, if the write command points to the address information A0, a mark of the marker bar corresponding to the address information A0 is looked up from the lookup table 30 by taking the address information A0 pointed to by the write command as an index, to determine whether the address information A0 pointed to by the write command is valid based on the mark. If the write command points to the address information A1, a mark of the marker bar corresponding to the address information A1 is looked up from the lookup table 30 by taking the address information A1 pointed to by the write command as an index, to determine whether the address information A1 pointed to by the write command is valid based on the mark.

A write operation is performed on a memory cell corresponding to the address information pointed to by the write command if the mark of the address information pointed to by the write command is valid. It is stopped performing the write operation on the memory cell corresponding to the address information pointed to by the write command if the mark of the address information pointed to by the write command is invalid.

For example, in the lookup table 30, if the mark of the marker bar corresponding to the address information A0 pointed to by the write command is the invalid mark DIS, it is stopped performing the write operation on the memory cell corresponding to the address information A0 pointed to by the write command. In the lookup table 30, if the mark of the marker bar corresponding to the address information A1 pointed to by the write command is the valid mark EN, the write operation is performed on the memory cell corresponding to the address information A1 pointed to by the write command.

In Step S32, the lookup table 30 is backed up into the non-volatile memory cell according to a preset rule. This step is the same as Step S13, and the preset rule may be a preset cycle or a preset action.

In Step S33, the lookup table 30 is loaded from the non-volatile memory cell after the memory device is enabled. This step is the same as Step S14. The mark of the address information recorded in the lookup table 30 serve as the initial mark of the subsequent read/write operation, which can prevent the address information having been marked from being re-marked after the memory device is powered on again. Therefore, the running speed of the memory device can be greatly increased.

Further, in this third embodiment, after the step of stopping performing the write operation on the memory cell corresponding to the address information pointed to by the write command, the method for reading and writing also includes: converting the address information pointed to by the write command to another address information. After this step if performed, it may be determined whether the other address information is valid. This determination method is the same as Step S31. The write operation is performed on a memory cell corresponding to the other address information if a mark of the other address information is a valid mark. If the mark of the other address information is an invalid mark, it is stopped performing the write operation on the memory cell corresponding to the other address information, and the address information pointed to by the write command is converted to still another address information.

For example, after the step of stopping performing the write operation on the memory cell corresponding to the address information A0 pointed to by the write command, the address information A0 pointed to by the write command is converted to another address information A1. That is, after this step is performed, the write command points to the address information A1. Further, it is determined whether the address information A1 pointed to by the write command is valid, i.e., it is determined whether the mark of the address information A1 is valid. For example, in this embodiment, the mark of the marker bar corresponding to the address information A1 is the invalid mark EN. In this case, the write operation is performed on the memory cell corresponding to the address information A1. For example, in other embodiments, the address information A1 is invalid. In this case, it is stopped performing the write operation on the memory cell corresponding to the address information A1, the address information A1 pointed to by the write command is converted to address information A2, and it is continued to determine whether the address information A2 is valid. The above operations are not stopped until the mark of the address information pointed to by the write command is the valid mark.

Further, in this third embodiment, the method for reading and writing also includes: forming a second ECC corresponding to data to be written in the write operation, and writing the second ECC together with the data to be written into the memory cell corresponding to the address information pointed to by the write command. When reading data in the memory cell, both the data and the second ECC are read simultaneously, and the second ECC is decoded to restore data where an error likely occurs.

In this third embodiment, according to the method for reading and writing provided by the present disclosure, after a write command is applied to the memory device, it is determined whether the address information pointed to by the write command is valid, to serve as a basis for determining whether to perform the write operation on a memory cell, thereby avoiding performing the write operation on an invalid memory cell. In this way, the reliability of the memory device is improved, and the lifespan of the memory device is prolonged.

The present disclosure also provides a memory device that can implement the above method for reading and writing. The memory device includes, but is not limited to, a volatile memory such as a dynamic random access memory (DRAM) and a static random access memory (SRAM), and a non-volatile memory such as an NAND flash memory, an NOR flash memory, a ferroelectric random access memory (FeRAM), a resistance random access memory (RRAM), a magnetic random access memory (MRAM), and a phase change random access memory (PCRAM), etc.

Figure 4:
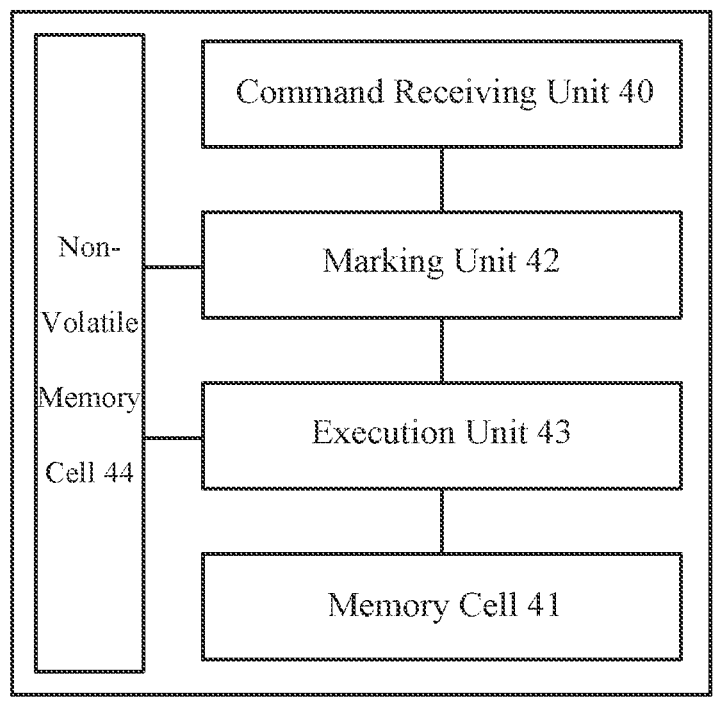
FIG. 4 is a schematic structural diagram of a memory device according to a first embodiment of the present disclosure.

With reference to FIG. 4, a schematic structural diagram of the memory device according to a first embodiment of the present disclosure is illustrated. The memory device includes: a command receiving unit 40, a memory cell 41, a marking unit 42, an execution unit 43, and a non-volatile memory cell 44.

The command receiving unit 40 is configured to receive a read/write command applied to the memory device, or address information pointed to by the read/write command.

The memory cell 41 corresponds to the address information pointed to by the read/write command, and is configured to store data. In the present disclosure, the memory cell 41 may be a memory unit well known to those skilled in the art, such as a basic memory cell, a memory segment, memory pages, and memory blocks, which are not limited by the present disclosure.

The marking unit 42 is configured to store mark information. The mark information records whether the address information is valid or invalid. In this embodiment, the marking unit 42 is a lookup table, address information of the memory cell 41 and an initial mark of the address information are recorded in the lookup table, and the initial mark may be a valid mark. The initial mark of the address information is revised as invalid in the lookup table if an error occurs in the data to be read out. The initial mark is retained if no error occurs in the data to be read out. In another embodiment of the present disclosure, a mark corresponding to the address information is not initially set as valid in the lookup table. The address information is marked as invalid in the lookup table if an error occurs in the data to be read out. The address information is marked as valid in the lookup table if no error occurs in the data to be read out.

The execution unit 43 is configured to perform a read/write operation on the memory cell 41. Further, the execution unit 43 is also connected to the marking unit 42, and the execution unit 43 is configured to perform the read/write operation on the memory cell corresponding to the address information, or to stop performing the read/write operation on the memory cell corresponding to the address information according to the mark information of the marking unit 42. In some embodiments, if the mark information corresponding to the address information pointed to by the read/write command is the valid mark, the execution unit 43 performs the read/write operation on the memory cell corresponding to the address information. If the mark information corresponding to the address information pointed to by the read/write command is the invalid mark, the execution unit 43 stops performing the read/write operation on the memory cell corresponding to the address information.

It is to be noted that in other embodiments, the command receiving unit 40 may be directly connected to the execution unit 43, and the marking unit 42 is connected to the execution unit 43 and is not connected to the command receiving unit 40. The present disclosure does not limit this connection mode, and those of ordinary skill in the art may set to implement the above function as required.

The non-volatile memory cell 44 is configured to back up the address information and the mark information according to a preset rule. In some embodiments, in this embodiment, the non-volatile memory cell 44 is configured to back up the lookup table according to a preset rule.

The non-volatile memory 44 may be a non-volatile memory structure such as NAND, NOR, FeRAM, RRAM, MRAM, and PCRAM, etc.

The non-volatile memory cell 44 is connected to the execution unit 43, and the execution unit 43 controls the address information and the mark information to be backed up into the non-volatile memory cell 44 according to a preset rule. The preset rule may be a preset cycle or a preset action. Further, when the preset action is a trigger action inputted by the user, the command receiving unit 40 can receive the trigger action, and the execution unit 43 can control the address information and the mark information to be backed up into the non-volatile memory cell 44 according to the trigger action.

Further, the execution unit 43 also can control the address information and the mark information backed up in the non-volatile memory cell 44 to be loaded into the marking unit 42. For example, after the memory device is enabled, the execution unit 43 controls the address information and the mark information backed up in the non-volatile memory cell 44 to be loaded into the marking unit 42, to serve as a basis for the subsequent read/write operation, which can prevent the address information having been marked from being re-marked after the memory device is powered on again. Therefore, the running speed of the memory device is greatly increased.

Figure 5:
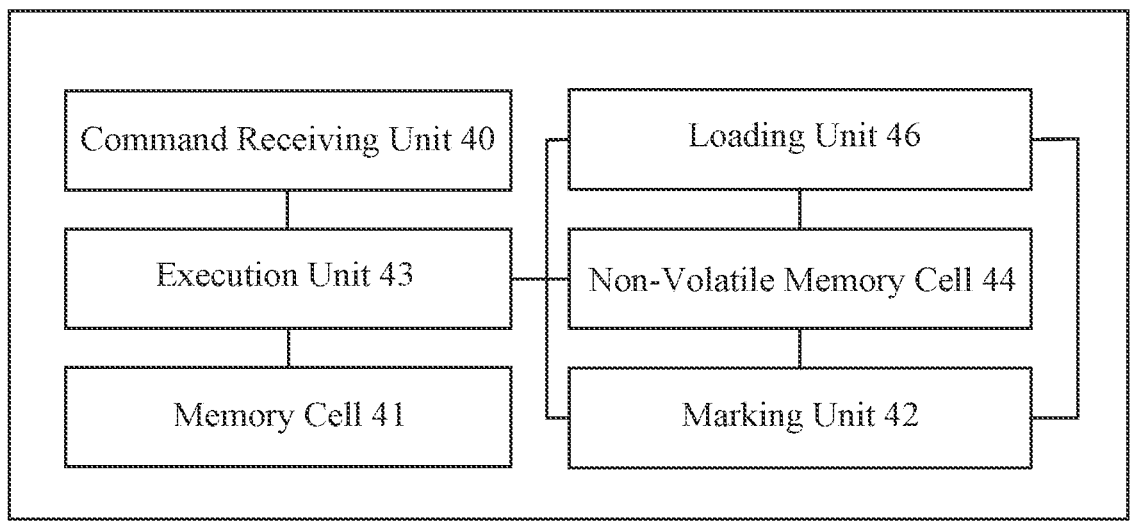
FIG. 5 is a schematic structural diagram of a memory device according to a second embodiment of the present disclosure.

Further, the memory device of the present disclosure also provides a second embodiment. With reference to FIG. 5, a schematic structural diagram of the memory device according to the second embodiment of the present disclosure is illustrated. The second embodiment differs from the first embodiment in that the memory device also includes a loading unit 46.

The loading unit 46 is connected to the marking unit 42 and the non-volatile memory cell 44, and the loading unit 46 is configured to load the address information and the mark information backed up in the non-volatile memory cell 44 into the marking unit 42. Further, the loading unit 46 is also connected to the execution unit 43, and the execution unit 43 controls the loading unit 46 to load the address information and the mark information backed up in the non-volatile memory cell 44 into the marking unit 42. For example, after the memory device is enabled, the execution unit 43 controls the loading unit 46 to load the address information and the mark information backed up in the non-volatile memory cell 44 into the marking unit 42, to serve as a basis for the subsequent read/write operation, which can prevent the address information having been marked from being re-marked after the memory device is powered on again. Therefore, the running speed of the memory device is greatly increased.

Figure 6:
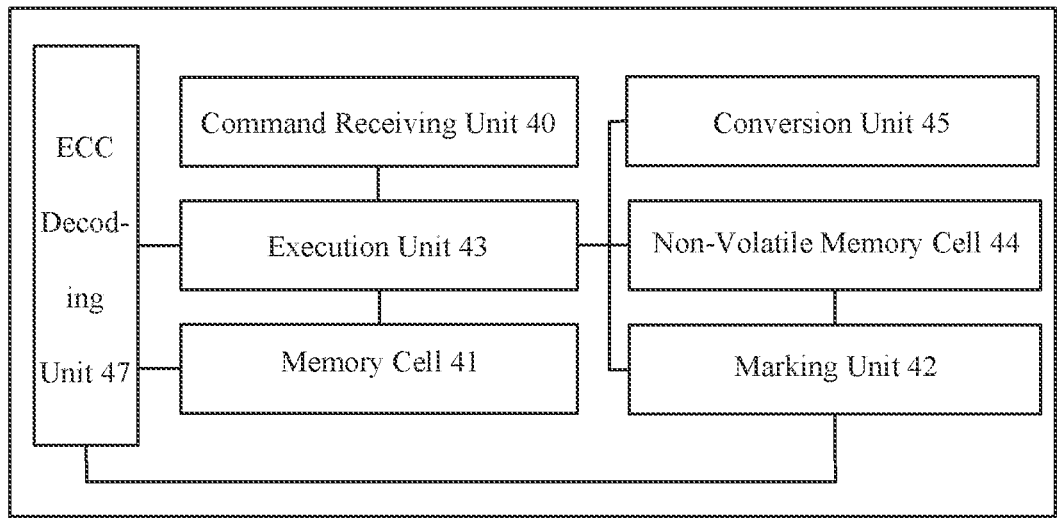
FIG. 6 is a schematic structural diagram of a memory device according to a third embodiment of the present disclosure.

Further, the memory device of the present disclosure also provides a third embodiment. With reference to FIG. 6, a schematic structural diagram of the memory device according to the third embodiment of the present disclosure is illustrated. The third embodiment differs from the first embodiment in that the memory device also includes an ECC decoding unit 47.

The ECC decoding unit 47 is connected to the execution unit 43, the memory cell 41, and the marking unit 42.

The ECC decoding unit 47 is configured to decode the first ECC corresponding to the data to be read out in the read operation to restore data where an error likely occurs. Furthermore, the mark information of the marking unit 42 may be revised based on a fact whether the ECC decoding unit 47 restores the data. The ECC decoding unit 47 is also configured to form a second ECC corresponding to data to be written in the write operation.

In some embodiments, in this embodiment, the command receiving unit 40 receives a write command. When performing the write operation on the memory cell corresponding to the address information pointed to by the write command, the ECC decoding unit 47 forms an ECC corresponding to data to be written in the write operation, and stores the ECC into the memory cell 41 corresponding to the address information pointed to by the write command. After the write operation is completed, when a subsequent read operation is performed on the memory cell corresponding to the address information, the ECC decoding unit 47 decodes the ECC. It may be determined whether an error occurs in the data to be read out read by the read operation according to decoding of the ECC decoding unit 47, and then the mark information of the marking unit 42 is revised.

Further, in this embodiment, it may be determined whether to revise the mark information of the marking unit 42 based on a fact whether the ECC decoding unit 47 restores the data. In some embodiments, if the ECC decoding unit 47 decodes the ECC and restores the data, this means that an error occurs in the data to be read out read by the read operation. In this case, the marking unit 42 marks the address information of the memory cell as the invalid mark. If the ECC decoding unit 47 decodes the ECC, but does not restore the data, this means that no error occurs in the data to be read out read by the read operation. In this case, the marking unit 42 revises the mark of the address information as the valid mark, or the initial mark of the address information is retained.

In other embodiments of the present disclosure, the ECC decoding unit 47 decodes the ECC. Although the ECC decoding unit 47 does not restore the data, it may be still determined that an error occurs in the data to be read out read by the read operation according to decoding of the ECC decoding unit 47. In this case, the marking unit 42 marks the address information of the memory cell as the invalid mark.

Further, in the third embodiment of the memory device, the memory device also includes a conversion unit 45. The conversion unit 45 may be connected to the execution unit 43. After stopping performing the read/write operation on the memory cell corresponding to the address information, the conversion unit 45 converts the address information pointed to by the read/write command to another address information. The execution unit 43 performs the read/write operation on the other address information according to the mark information of the marking unit.

Figure 7:
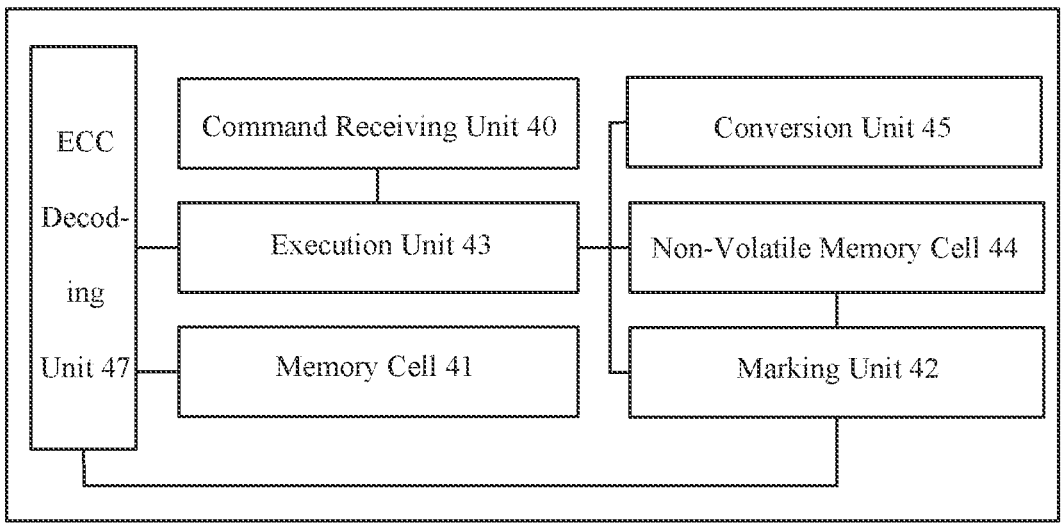
FIG. 7 is a schematic structural diagram of a memory device according to a fourth embodiment of the present disclosure.

In the third embodiment, the execution unit 43 not only is connected to the ECC decoding unit 47, but also is connected to the memory cell 41. However, in a fourth embodiment of the present disclosure, with reference to FIG. 7, a schematic structural diagram of the memory device according to the fourth embodiment, the execution unit 43 is connected to the ECC decoding unit 47, and the ECC decoding unit 47 is further connected to the memory cell 41. It is to be understood that different connection relationships may be selected according to different needs.

Figure 8:
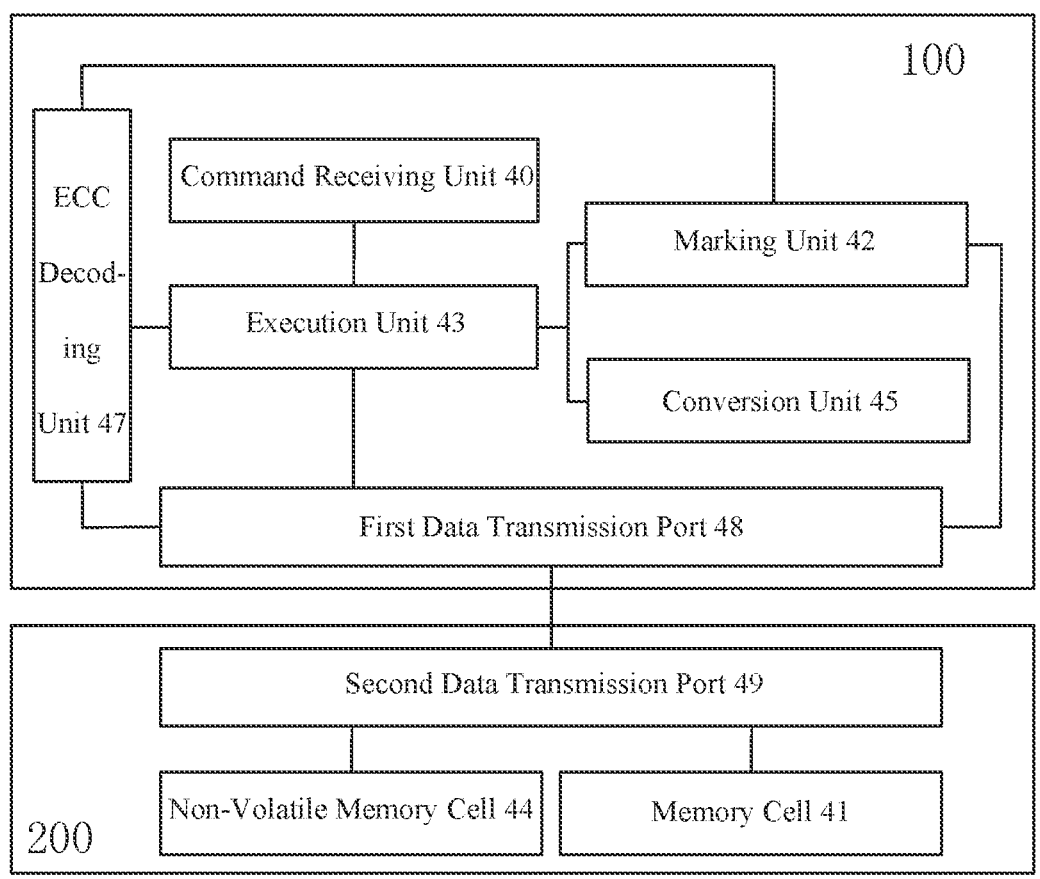
FIG. 8 is a schematic structural diagram of a memory device according to a fifth embodiment of the present disclosure.

The memory device of the present disclosure also provides a fourth embodiment. With reference to FIG. 8, a schematic structural diagram of the memory device according to a fifth embodiment of the present disclosure is illustrated. The fifth embodiment differs from the third embodiment in that the memory device also includes a logic layer 100 and a plurality of memory layers 200 (only one memory layer is shown in FIG. 8). The plurality of memory layers 200 may be DRAM chips, and the logic layer 100 may be a layer provided with a logic circuit, such as a control chip or an interposer. The plurality of memory layers 200 may be vertically stacked above or below the logic layer 100, but the present disclosure is not limited thereto. Furthermore, the plurality of memory layers 200 may be integrated together using other packaging methods.

The command receiving unit 40, the marking unit 42, the execution unit 43, the ECC decoding unit 47 and the conversion unit 45 may be arranged in the logic layer 100. The memory cell 41 and the non-volatile memory cell 44 are arranged in the first memory layer 200. In another embodiment of the present disclosure, the marking unit 42 and the ECC decoding unit 47 may also be arranged in the first memory layer 200, and the non-volatile memory cell 44 may be arranged in the logic layer 100.

In this embodiment, the logic layer 100 has at least one first data transmission port 48, and the first memory layer 200 has at least one second data transmission port 49. Instructions and data are transmitted between the logic layer 100 and the plurality of memory layers 200 through the first data transmission port 48 and the second data transmission port 49.

Further, in the fifth embodiment, the execution unit 43 not only is connected to the ECC decoding unit 47, but also is connected to the memory cell 41 through the first data transmission port 48 and the second data transmission port 49. However, in a sixth embodiment of the present disclosure, the execution unit 43 is connected to the ECC decoding unit 47, and the ECC decoding unit 47 is connected to the memory cell 41 through the first data transmission port 48 and the second data transmission port 49. It is to be understood that different connection relationships may be selected according to different needs.

The memory device of the present disclosure can mark an invalid memory cell when the user uses the memory device, such that a read/write operation may be selectively performed on a memory cell. In this way, the reliability of the memory device is greatly improved, and the lifespan of the memory device is greatly prolonged.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A method for reading and writing, comprising:
   applying a read command to a memory device, the read command pointing to address information;
   reading data to be read out from a memory cell corresponding to the address information pointed to by the read command;
   setting a mark of the address information pointed to by the read command as invalid if an error occurs in the data to be read out, and backing up the address information pointed to by the read command and the mark into a non-volatile memory cell according to a preset rule, wherein the preset rule is a preset cycle or a preset action; and
   loading the address information and the mark from the non-volatile memory cell after the memory device is enabled, wherein address information not marked as invalid is initially set as valid.

2. The method for reading and writing according to claim 1, wherein the preset rule is a preset cycle or a preset action.

3. The method for reading and writing according to claim 1, wherein the reading data to be read out from a memory cell corresponding to the address information pointed to by the read command further comprises: reading, from the memory cell corresponding to the address information pointed to by the read command, a first error correction code (ECC) corresponding to the data to be read out; and
   wherein a method for determining whether an error occurs in the data to be read out comprises: decoding the first ECC to determine whether the error occurs in the data to be read out.

4. The method for reading and writing according to claim 3, comprising: providing a lookup table, wherein address information of the memory cell and an initial mark of the address information are recorded in the lookup table, and the initial mark of the address information pointed to by the read command is revised as invalid in the lookup table if an error occurs in the data to be read out.

5. The method for reading and writing according to claim 4, wherein the initial mark comprises valid or invalid.

6. The method for reading and writing according to claim 4, comprising:
   applying a write command to the memory device;
   performing a write operation on a memory cell corresponding to address information pointed to by the write command if a mark of the address information pointed to by the write command is valid; and
   stopping performing the write operation on the memory cell corresponding to the address information pointed to by the write command if the mark of the address information pointed to by the write command is invalid.

7. The method for reading and writing according to claim 6, wherein when applying the write command to the memory device, the mark is looked up from the lookup table by taking the address information pointed to by the write command as an index.

8. The method for reading and writing according to claim 6, wherein after the stopping performing the write operation on the memory cell corresponding to the address information pointed to by the write command, the method for reading and writing further comprises:
   converting the address information pointed to by the write command to another address information.

9. The method for reading and writing according to claim 6, wherein the performing a write operation on a memory cell corresponding to address information pointed to by the write command further comprises:

forming a second ECC corresponding to data to be written in the write operation, and writing the second ECC together with the data to be written into the memory cell corresponding to the address information pointed to by the write command.

10. The method for reading and writing according to claim 1, wherein after the applying a read command to the memory device, and before the reading data to be read out from a memory cell corresponding to the address information pointed to by the read command, the method further comprises:

determining whether the address information pointed to by the read command is valid; and performing a read operation on the memory cell corresponding to the address information pointed to by the read command if the address information pointed to by the read command is valid.

11. The method for reading and writing according to claim 10, comprising:

determining, if the address information pointed to by the read command is invalid, whether a write command has been executed on the address information pointed to by the read command after the address information pointed to by the read command is marked as invalid; and pointing the read command to address information pointed to by the write command to perform a read operation on a memory cell corresponding to the address information pointed to by the read command if a determination result is yes.

12. A memory device, comprising:

a command receiving unit, configured to receive a read/write command;

a memory cell, configured to correspond to address information pointed to by the read/write command;

an execution unit, configured to perform a read/write operation on the memory cell;

a marking unit, configured to store address information and mark information corresponding to the address information, wherein the mark information records whether the address information is valid or invalid;

a non-volatile memory cell, configured to back up the address information and the mark information according to a preset rule; and a loading unit, wherein the loading unit is connected to the marking unit and the non-volatile memory cell, the loading unit being configured to load the address information and the mark information backed up in the non-volatile memory cell into the marking unit.

13. The memory device according to claim 12, further comprising an ECC decoding unit, wherein the ECC decoding unit is configured to decode a first ECC corresponding to data to be read out in the read operation and to form a second ECC corresponding to data to be written in the write operation.

14. The memory device according to claim 12, wherein the marking unit is a lookup table, address information of the memory cell and an initial mark of the address information being recorded in the lookup table, the initial mark of the address information being revised as invalid in the lookup table if an error occurs in data to be read out.

15. The memory device according to claim 12, wherein the execution unit is further connected to the marking unit, the execution unit being configured to perform a read/write operation on the memory cell corresponding to the address information or to stop performing the read/write operation on the memory cell corresponding to the address information according to the mark information of the marking unit.

16. The memory device according to claim 15, further comprising a conversion unit, wherein the conversion unit is configured to convert the address information pointed to by the read/write command to another address information after stopping performing the read/write operation on the memory cell corresponding to the address information.

17. The memory device according to claim 12, comprising a logic layer and at least one memory layer, wherein the command receiving unit, the marking unit and the execution unit are arranged in the logic layer, the memory cell being arranged in the memory layer, and the non-volatile memory cell being arranged in the logic layer or the memory layer.

* * * * *